(12) United States Patent
Huang et al.

(10) Patent No.: US 6,967,886 B2
(45) Date of Patent: Nov. 22, 2005

(54) PSEUDO STATIC RANDOM ACCESS MEMORY AND DATA REFRESH METHOD THEREOF

(75) Inventors: Pei Jey Huang, Hsinchu (TW); Chien Yi Chang, Hsinchu (TW)

(73) Assignee: Elite Semiconductor Memory Technology, Inc., Hsinchu (TW)

( * ) Notice: Subject to any disclaimer, the term of this patent is extended or adjusted under 35 U.S.C. 154(b) by 0 days.

(21) Appl. No.: 10/778,850

(22) Filed: Feb. 13, 2004

(65) Prior Publication Data

US 2005/0180241 A1  Aug. 18, 2005

(51) Int. Cl.$^7$ ............................................. G11C 7/00
(52) U.S. Cl. ..................... 365/222; 365/233; 365/233.5
(58) Field of Search ................................ 365/222, 233, 365/233.5, 236

(56) References Cited

U.S. PATENT DOCUMENTS

| | | | |
|---|---|---|---|
| 4,360,903 A | * 11/1982 | Plachno et al. | ............. 365/222 |
| 6,111,814 A | * 8/2000 | Schaefer | ................... 365/233.5 |
| 6,275,437 B1 | * 8/2001 | Kim et al. | .................... 365/222 |
| 6,741,515 B2 | * 5/2004 | Lazar et al. | ................. 365/222 |
| 6,813,212 B2 | * 11/2004 | Takahashi et al. | ........... 365/222 |
| 6,842,392 B2 | * 1/2005 | Mizugaki et al. | ............ 365/222 |

* cited by examiner

Primary Examiner—Trong Phan

(74) Attorney, Agent, or Firm—Egbert Law Offices

(57) ABSTRACT

A data refresh method of a pseudo static random access memory is implemented by the following procedure. First, an address string and a refresh signal are provided, in which the address string is used for the reference of data reading and writing positions. Secondly, within at least one address of the address string, the active time of a word line of the PSRAM is set to be equivalent to or less than a half of the period of the refresh signal. Then, refreshing performs while the word line is off, and reading and writing are performed while the word line is active. If writing is requested while the word line is off, the writing will be performed when an address transition detection signal ATD switches to the high level in the next address.

10 Claims, 6 Drawing Sheets

PSEUDO STATIC RANDOM ACCESS MEMORY AND DATA REFRESH METHOD THEREOF

FIELD OF THE INVENTION

The present invention is related to a pseudo static random access memory (PSRAM) and data refresh method thereof.

BACKGROUND OF THE INVENTION

A PSRAM functions as a static random access memory (SRAM) based on an architecture of a dynamic random access memory (DRAM). Traditionally, two different word lines of a DRAM active at the same time are inhibited. In addition to writing and reading, a DRAM has to be refreshed periodically to avoid the event of data loss. However, the refresh operation has to activate another word line, so the timings of reading, writing and refreshing has to be differentiated from each other to prevent the conflict of two word lines active simultaneously.

As shown in FIG. 1, the timings of reading, writing and refreshing are determined by an address transition detection signal ATD. The ATD signal switches to a high level whenever an address transition occurs, e.g., from address N−1 to address N, or from address N to address N+1. The ATD signal remains at a high level for a time period TRC_D, namely cycle time or operation time of the DRAM, and then switches to a low level. While the ATD signal is at the low level, the word line of the address is active, i.e., at the high level, for being written and read. On the contrary, while the ATD signal is at the high level, the word line is deactivated for refresh operation.

Under the SRAM operation, an address cannot be identified to perform reading, writing or refreshing when the address is at a ready state, and the active time of a word line, normally equivalent to the TRC_D, is limited, so as to prevent the refresh operation from being hindered. However, the above-mentioned operation has several drawbacks. For instance, if a refresh signal is generated after a reading signal, and a writing signal is generated after a refresh operation is done, because the word line has to be off before refreshing, the word line has to be reactivated for writing. Accordingly, current consumption is significantly increased.

BRIEF SUMMARY OF THE INVENTION

The objective of the present invention is to provide a PSRAM and data refresh method thereof, with a view to resolving the conflict of reading, writing and refreshing, and diminishing current consumption.

To achieve the above objective, a PSRAM data refresh method is disclosed. First, an address string and a refresh signal are provided, in which the address string is used for the reference of data reading and writing positions. Secondly, within at least one address of the address string, the active time of a word line of the PSRAM is set to be equivalent to or less than a half of the period of the refresh signal, i.e., half the period of the refresh signal at most. Then, refreshing performs while the word line is off, and reading and writing are performed while the word line is active. If writing is requested while the word line is off, the writing will perform when an address transition detection signal ATD switches to the high level in the next address.

The PSRAM put forth in the present invention comprises a memory circuit and a read/write and refresh control apparatus. The read/write and refresh apparatus comprises an address transition detector, a refresh mode controller and a control circuit, where the address transition detector is used for generating an address transition signal, the refresh mode controller receives the address transition signal and an read/write signal inputted externally to generate a register write signal and a refresh mode signal. The control circuit receives the address transition signal, the register write signal, the refresh mode signal, the read/write signal and a refresh signal inputted from the memory circuit to generate a refresh execution signal and a read/write execution signal which are then transmitted to the memory circuit for read/write and refresh operations.

DETAILED DESCRIPTION OF THE INVENTION

The basic operation of the present invention is to extend the active time of a word line in accordance with the period of the refresh signal, with a view to preventing the conflict of the reading, writing and refreshing, and diminishing current consumption. Embodiments of the present invention are now being described, with reference to the accompanying drawings.

Generally, refreshing 4K word lines of data requires 64 milliseconds, and thus the refresh interval is approximately 16 microseconds ($\mu$s) between every two world lines, i.e., the period of a related refresh signal is approximately 16 $\mu$s. The case based on a refresh interval of 16 $\mu$s is exemplified as follows.

Figure 1:
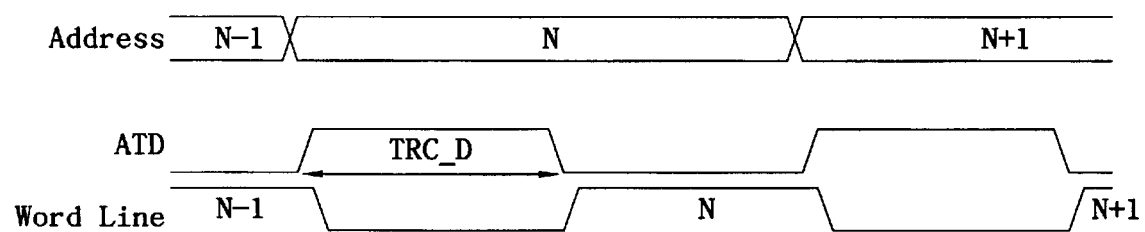
FIG. 1 is a schematic view illustrating signal timings of a known PSRAM.
Figure 2:
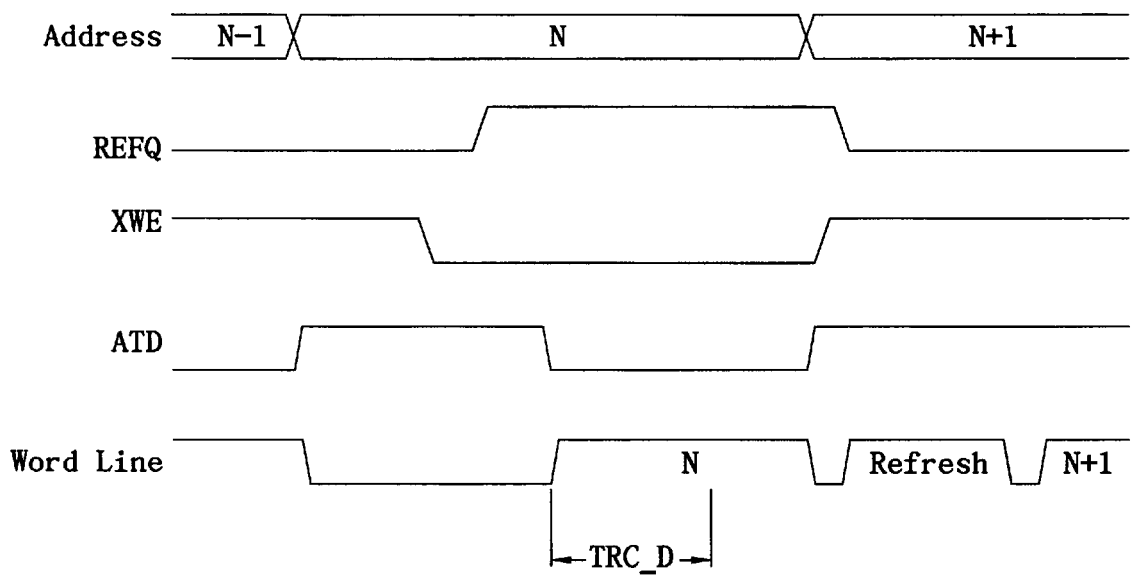
FIG. 2 is another schematic view illustrating signal timings of the first embodiment of the PSRAM in accordance with the present invention.

FIG. 2 illustrates the case when the period of an address N is less than 8 $\mu$s. When a transition from an address N−1 to an address N address occurs in an address string, an address transition detection signal ATD is switching to the high level, and then the word line of the address N−1 is getting off. At this moment, a refresh signal REFQ is at the low level, so no word line is activated. Then, as the ATD signal goes back to the low level, the word line of the N address is activated for reading and writing the data of the address N until the address string transits to an address N+1. In this embodiment, the word line is not turned off right after the period TRC_D runs out, and is turned off until the ATD signal switches to the high level again. Because the period of the address N is less than 8 $\mu$s, the active time of the word line is equivalent to that of the period of the address N minus the signal width of the ATD signal. In other words, the active time of the word line is equivalent to or less than half the refresh interval. The REFQ signal switches to the high level at the time the ATD signal is at the high level, however, the word line is activated subsequently, so refreshing is postponed to the time that the ATD signal switches to the high level at the beginning of the address N+1. All the timings of reading, writing and refreshing are illustrated in the word line timing diagram, in which the refresh action is designated as "refresh" to differentiate from reading and writing. In addition, "refresh" does not mean that the word line for reading and writing is active. Moreover, if the REFQ signal requests to perform refreshing when the word line is active, the refresh action cannot be performed until the word line is off.

Figure 3:
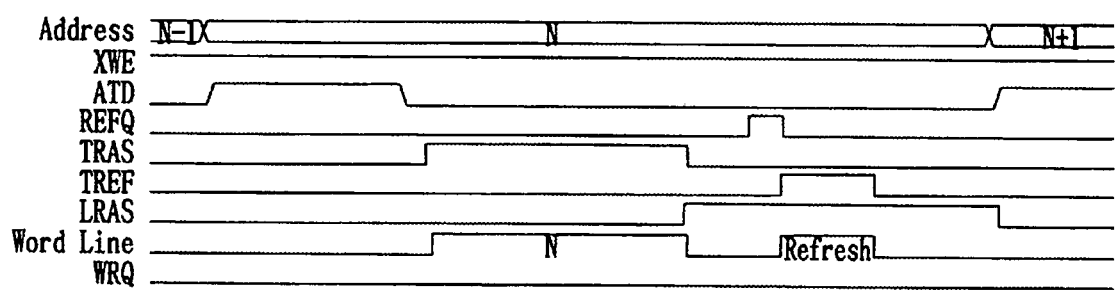
FIG. 3 is another schematic view illustrating signal timings of the second embodiment of the PSRAM in accordance with the present invention.

Referring to FIG. 3, the longest active time of a word line is determined as 8 μs also, but the period of the address N is larger than 8 μs, which may occur in a PSRAM of low frequency and low power. For the convenience of control, an LRAS mode regarding refresh control is employed. When a word line is turned off, the LRAS mode is active subsequently, i.e., the LRAS signal switches to the high level. At this time, refreshing is allowed to be performed. For instance, the REFQ signal goes to the high level while the LRAS signal is at the high level, and thus refreshing performs immediately.

The timings illustrated in FIG. 4 are similar with that of FIG. 3, when a read/write signal XWE goes to the low level, the word line is off because the active time of the word line runs out the upper limit of 8 μs, and thus writing cannot be performed in the address N. Therefore, data has to be stored in a register, and be written as the next address (the address N+1) begins, i.e., the ATD signal switches to the high level. As usual, the front portion of the address N+1 may preserve a 30–70 nanosecond (ns) period for read/write the data of the address N or refreshing. Under such circumstance, the word line has to be activated twice during the period of the address N+1, which is similar with the manner employed in the prior art, nevertheless, at this time the address active period is tremendously increased, e.g., the longest active period of 8 μs, which is around 100 times of the traditional one of around 70 ns. Therefore, if the original current is 20 milliampere (mA), the present current will decrease to around 200 microampere (μA). As a result, the current of the case shown in FIG. 4 is only around 400 μA, which still keep the feature of low current consumption.

In fact, the active periods of the word lines of the above embodiments may be reduced from half the period of the refresh signal, but the extent of the decrease of current consumption has to be taken into account. If the active time of the word line is too short, the reduction of current consumption will be ineffective. Preferably, the active time of the word line is between a quarter and a half of the period of the refresh signal, i.e., between 4 μs to 8 μs in this embodiment.

Figure 4A:
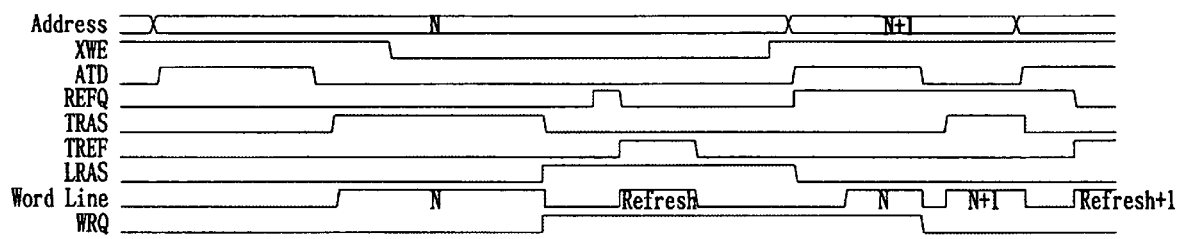
FIGS. 4(a) and 4(b) illustrate signal timings of the third embodiment of the PSRAM in accordance with the present invention.
Figure 4B:
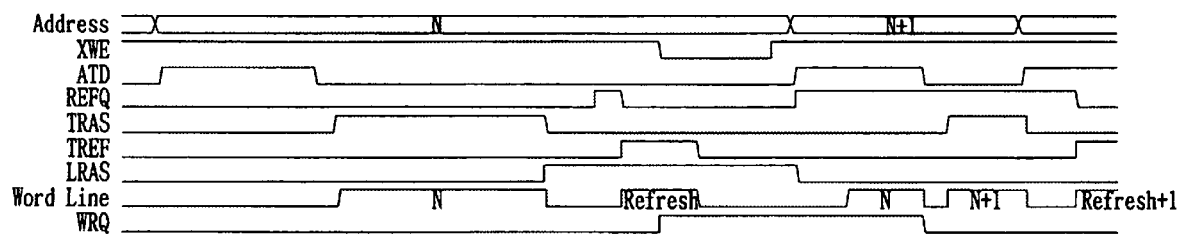
Figure 5:
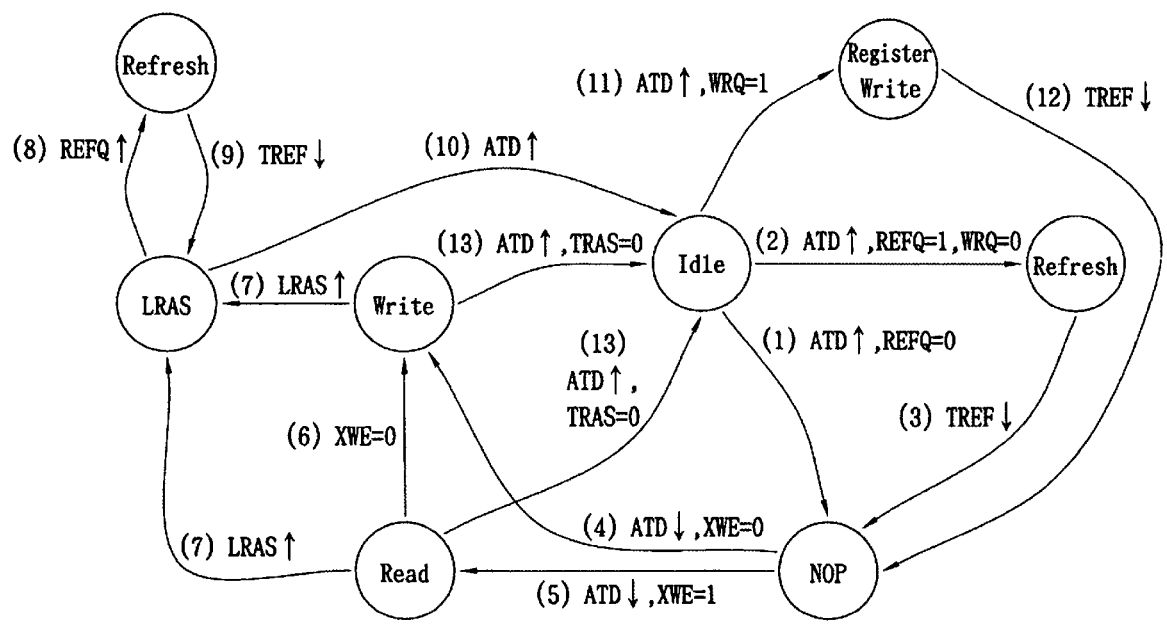
FIG. 5 is a schematic view showing a state transition diagram of the PSRAM in accordance with the present invention.

FIG. 5 is the state transition diagram of the PSRAM data refresh method in accordance with the present invention, with a view to illustrating the operations of the embodiments shown in FIGS. 2–4. The word line of an address is activated for reading, writing and refreshing after the word line of the previous address is off. The PSRAM is set to be under an Idle mode at first. If the ATD signal switches to high level and no REFQ signal inputs, the PSRAM goes to a NOP (No Operation) mode (path (1)), if the ATD signal switches to high level while the REFQ is at high level and no WRQ signal inputs (i.e. WRQ=0), the PSRAM goes to a Refresh mode (path (2)). Under the Refresh mode, TREF keeps at high level until the refresh is finished. If TREF signal switches to low level, it means the refresh is done and the PSRAM goes to the NOP mode (path (3)). Under the NOP mode, if ATD signal switches to low level while the XWE is at low level, the PSRAM goes to a Write mode (path (4)). If ATD signal switches to low level and XWE signal switch to high level, the PSRAM goes to a Read mode (path (5)). Under the Read mode, the PS RAM goes to the Write mode (path (6)) when XWF signal switches to low level (i.e., XWE-0). If the period of address N holds (refer to FIG. 3, FIG. 4(a) and FIG. 4(b)) larger than 8 μs under the Read or Write modem the PSRAM goes to a LRAS mode (i.e., LRAS is at high level) (path (7)). Under the LRAS mode, if REFQ switches to high level, the PSRAM goes to the Refresh mode (path (8)). Under the Refresh mode, it TREF signal switches to low level, the PSRAM goes back to the LRAS mode (path (9))(also, refer to FIG. 3). Under the LRAS mode, if ATD signal switches to high level, the PSRAM goes to the Idle mode (path (10)). Now, if the WRQ signal is at high level (i.e., WRQ=1), the PSRAM goes to a Register mode (path (I 1)). The PSRAM goes to the NOP mode when TREF signal switches to the low level under the Register Write mode (path (12)). Under the Read or Write mode, when TRAS signal is at low level and ATD signal switches to high level, the PSRAM goes to the Idle mode (path (13)).

Figure 6:
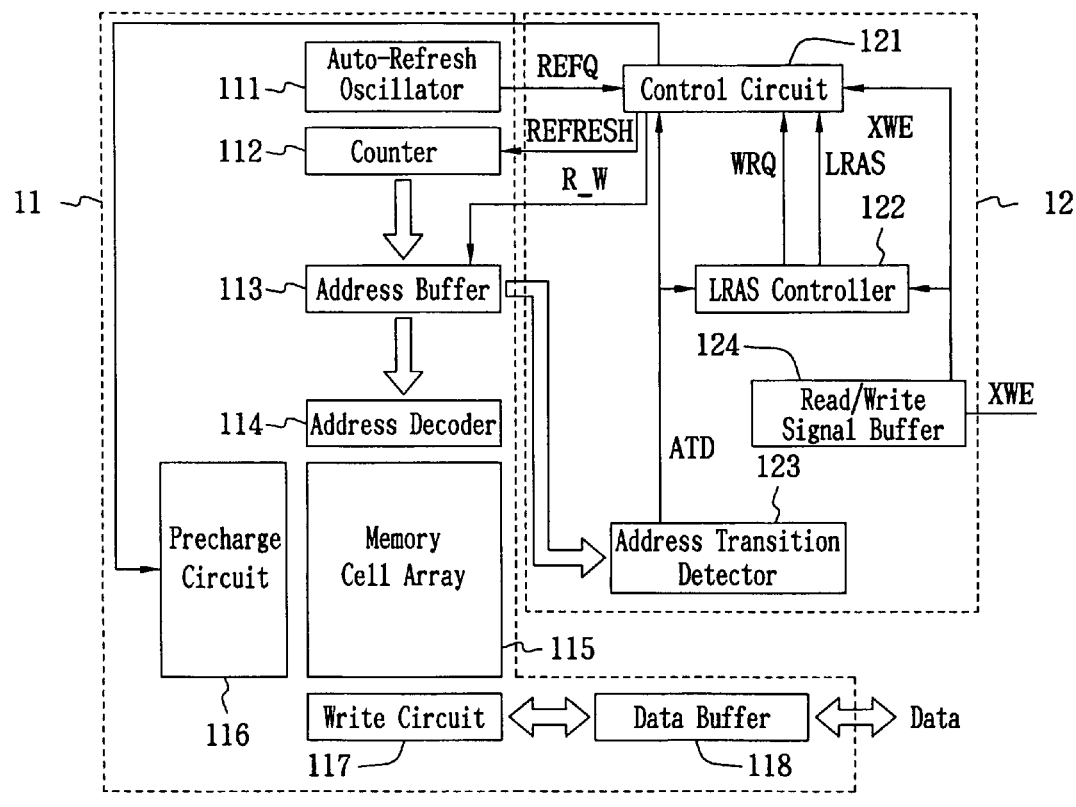
FIG. 6 is a block diagram illustrating a PSRAM in accordance with the present invention.

FIG. 6 illustrates the PSRAM in accordance with the present invention. A PSRAM 10 essentially comprises a known memory circuit 11 and an additional reading/write and refresh control apparatus 12. The memory circuit 11 comprises an auto-refresh oscillator 111, a counter 112, an address buffer 113, an address decoder 114, a memory cell array 115, a precharge circuit 116, a write circuit 117 and a data buffer 118. The read/write and refresh control apparatus 12 comprises a control circuit 121, a refresh mode controller (LRAS controller) 122, an address transition detector 123 and a read/write signal buffer 124. The address transition detector 123 connected to the address buffer 113 is used for sensing address transition to generate an ATD signal which will be transferred to the LRAS controller 122 and control circuit 121. The external read/write signal XWE can be temporarily stored in the read/write signal buffer 124, and transferred to the LRAS controller 122 and control circuit 121. In addition to the ATD and XWE signals, the control circuit 121 receives the LRAS and WRQ signals generated from the LRAS controller 122 to generate a refresh execution signal REFRESH and a read/write execution signal R_W which are respectively transmitted to the counter 112 and address buffer 113 for reading, writing and refreshing in a timely manner.

The above-described embodiments of the present invention are intended to be illustrative only. Numerous alternative embodiments may be devised by those skilled in the art without departing from the scope of the following claims.

We claim:

1. A data refresh method of a pseudo static random access memory comprising the steps of:
   providing an address string;
   providing a refresh signal;
   determining an active time of a word line of the pseudo static random access memory within at least one address of the address string, wherein the active time is less than or equal to a half period of the refresh signal; and
   refreshing data while the word line is turned off.

2. The data refresh method of a pseudo static random access memory of claim 1, further comprising the step of writing and reading data concurrently while the word line is turned on.

3. The data refresh method of a pseudo static random access memory of claim 1, further comprising the step of:
reading and writing data of the current and next addresses within the period of the next address.

4. The data refresh method of a pseudo static random access memory of claim 3, wherein the next address has a period of 30–70 nanoseconds for reading and writing the data of the current at least one address.

5. The data refresh method of a pseudo static random access memory of claim 1, wherein the word line of the current at least one address is activated after the previous address is turned off within the reading and writing period of the word line.

6. The data refresh method of a pseudo static random access memory of claim 1, wherein the current word line is active before the next address appears.

7. The data refresh method of a pseudo static random access memory of claim 1, wherein the active time of the word line is between a quarter and a half of the period of the refresh signal.

8. The data refresh method of a pseudo static random access memory of claim 1, wherein the active time of the word line is between 4 $\mu$s and 8 $\mu$s.

9. A pseudo static random access memory comprising:
a memory circuit; and
a read/write and refresh control apparatus, comprising:
an address transition detector for generating an address transition signal;
a refresh mode controller receiving the address transition signal and a read/write signal inputted externally to generate a register-writing signal and a refresh mode signal; and
a control circuit receiving the address transition signal, the register-writing signal, the refresh mode signal, the read/write signal and a refresh signal from the memory circuit to generate a refresh execution signal and a read/write execution signal which is transmitted to the memory circuit for conducting reading, writing and refreshing.

10. The pseudo static random access memory of claim 9, wherein the read/write and refresh control apparatus further comprises a read/write signal buffer for storing the read/write signal.

* * * * *